United States Patent [19]

Moore et al.

[11] Patent Number: 5,513,119
[45] Date of Patent: Apr. 30, 1996

[54] HIERARCHICAL FLOORPLANNER FOR GATE ARRAY DESIGN LAYOUT

[75] Inventors: Wesley Moore, Morrisville; Ward Huffman, Durham, both of N.C.

[73] Assignee: Mitsubishi Semiconductor America, Inc., Durham, N.C.

[21] Appl. No.: 493,016

[22] Filed: Jun. 21, 1995

Related U.S. Application Data

[63] Continuation of Ser. No. 103,946, Aug. 10, 1993, abandoned.

[51] Int. Cl.$^6$ .................................................. G06F 17/50
[52] U.S. Cl. ........................................... 364/491; 364/490
[58] Field of Search ................................. 364/491, 490, 364/489, 488

[56] References Cited

U.S. PATENT DOCUMENTS

| | | | |
|---|---|---|---|
| 3,603,771 | 9/1971 | Isett et al. | 364/491 |
| 3,654,615 | 4/1972 | Freitag | 364/491 |
| 5,191,542 | 3/1993 | Murofushi | 364/490 |

OTHER PUBLICATIONS

"A Procedure for Placement of Standard-Cell VLSI Circuits" by Dunlop et al., IEEE Transactions on Computer-Aided Design, vol. CAD-4, No. 1, Jan. 1985, pp. 92–98.
"Circuit Layout" by J. Soukup, IEEE Proceeding, vol. 69, Oct. 1981, pp. 21–44.

*Primary Examiner*—Vincent N. Trans
*Attorney, Agent, or Firm*—Lowe, Price, LeBlanc & Becker

[57] ABSTRACT

A set of logic cells is hierarchically grouped to form groups to be placed on an integrated circuit for gate array layout. A user interface allows a user to interact with a placement system. The system is supplied with input design files defining the integrated circuit, the cells to be grouped, the groups to be placed, and input/output buffers to be placed on the perimeter of the integrated circuit for connecting the groups with external circuitry. The system reads the input design files to create a database used for placing desired input/output buffers and for hierarchically grouping the cells and placing the groups. The groups are defined by their size, determined using utilization and aspect ratio values of the areas where the cells are to be placed. The user is allowed to move the buffers and groups to any valid locations within the integrated circuit.

20 Claims, 3 Drawing Sheets

HIERARCHICAL FLOORPLANNER FOR GATE ARRAY DESIGN LAYOUT

This application is a continuation of application Ser. No. 08/103,946 filed Aug. 10, 1993, now abandoned.

TECHNICAL FIELD

The present invention relates generally to computer aided design and more particularly to a user-controlled placement system for automatic layout of integrated circuits.

BACKGROUND ART

Gate arrays are extremely complex integrated circuits, which are usually designed using a computerized design system comprised of a computer and the appropriate software. The design is typically divided into functional blocks made up of logic cells, which operate together to execute the desired function. A design may simulate correctly before layout but due to signal delays caused by the physical implementation it may not work when produced. Part of the physical implementation that can affect signal delay times is the logic cell placement process.

The placement process (floorplanning) has traditionally been a non-user interactive procedure with very little preplacement control. All of the logic components are placed automatically following some basic algorithm for "optimal" placement. This approach, however, does not consider design specific information such as correspondence between logic cells and functional blocks and interaction between functional blocks. This means that functional blocks can end up mixed and spread throughout all over the design area with no regard for intended interaction and critical timing. The latest generation of placement software products can handle directive parameters that enhance placement but lack an operational interface to process hierarchical design information under control of a user.

In view of the above, it would be desirable to provide a user-controlled placement system (floorplanner), which creates placement directives for the hierarchical groups of the logic cells on an integrated circuit.

DISCLOSURE OF THE INVENTION

Accordingly, one advantage of the invention is in providing a placement system, which allows a user to hierarchically group logic cells and place a set of groups on an integrated circuit.

Another advantage of the invention is in providing a placement system, which allows a user to graphically select and locate the desired groups on an integrated circuit.

A further advantage of the invention is in providing a placement system, which allows a user to graphically select and locate input/output (i/o) pins of an integrated circuit.

Another advantage of the invention is in providing a placement system, which allows a user to create and update files used for determining the actual placement of the logic cells on an integrated circuit.

The above and other advantages of the invention are achieved, at least in part, by providing a placement system for hierarchically grouping a plurality of design elements into groups and selecting their positions on an integrated circuit representing a design area. In response to design files supplied by a user, the placement system creates a database, which defines the design elements and the design area. Using the database, the placement system may display the integrated circuit with input/output buffers used for connecting the design elements within the integrated circuit with circuitry outside the design area. The user can select the required input/output buffers and move them to desired locations with respect to input/output pins of the integrated circuit. The groups of the design elements are placed on the integrated circuit based on the size of each group.

In accordance with a first aspect of the invention, the area to be occupied by the group may be defined by the number of design elements and aspect ratio in the group and the utilization of the integrated circuit. In accordance with a second aspect of the invention, the group may be located in a region determined by its aspect ratio.

In accordance with a third aspect of the invention, the design elements of the group may be placed at desired locations within the selected region.

In accordance with a preferred embodiment of the invention, the placement system may create output design files defining the selected positions of the groups and input/output buffers.

Still other advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

The best mode for carrying out the invention is based on a realization of a placement system that allows user interaction to place logic cells on an integrated circuit for forming the layout of a gate array.

Figure 1:
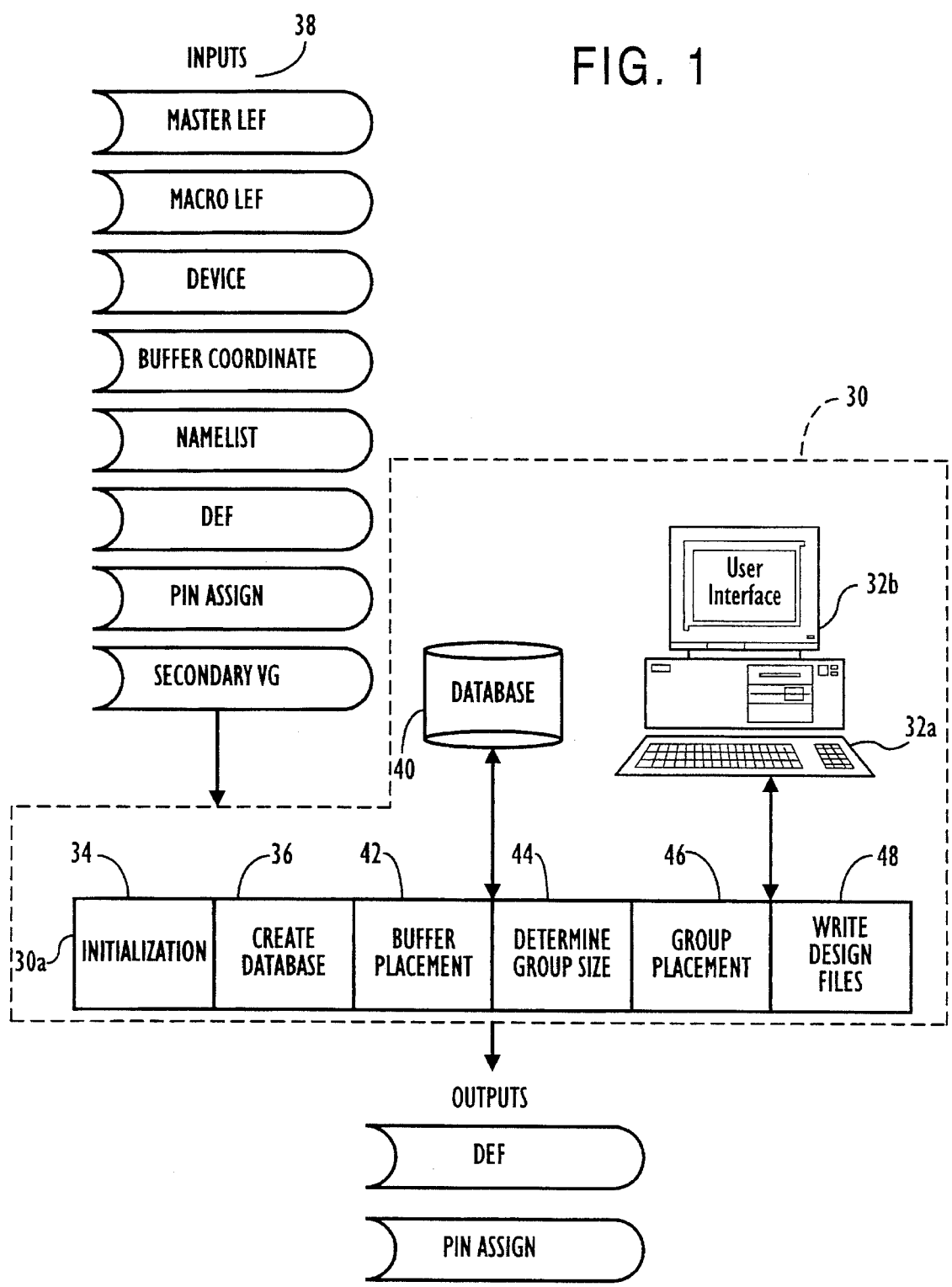
FIG. 1 shows a flow chart illustrating a placement system according to the present invention.

Referring to FIG. 1, the placement system 30 comprised of a user interface 32 having a keyboard 32a and a display 32b, which allows the user to control floorplanning by sending desired commands to the system and receiving responses. The placement system 30 also comprised of a database 40, which contains the information for defining the groups and input/output (i/o) buffers to be placed on an integrated circuit, the information required for grouping logic cells and the parameters of the integrated circuit. The system is supplied with various input design files 38, which contain previous design data as well as the librarian information for describing various available elements of the design. The structures of the design files 38 and database 40 are discussed later. A processor 30a of the placement system comprised of a unit 34 for providing system initialization, a unit 36 for reading the input design files 38 for creating the database 40, a unit 42 for using database information for placing i/o buffers on an integrated circuit under user control, a unit 44 for determining the size of an element group to be placed, a unit 46, which interacts with a user for placing the groups, and a unit 48 for writing design files to update the design data. The initialization unit 34 creates the widgets to appear at the display 32b. These widgets, described in more detail later, are used by the user to implement the various features of the system. The database creation procedure performed by the unit 36 involves reading various input design files 38 to extract the necessary information for creating the database 40. The information in the database 40 is read by the buffer placement unit 42 to display i/o buffers used for transferring data in and out of the integrated circuit and allows the user to select appropriate locations for i/o buffers. The group size determining unit 44 defines the size of an area to be occupied by a selected group of the logic cells and provides the group placement unit 46 with the information required to hierarchically group the logic cells and place the selected group on the integrated circuit under user control. As a result of the placement, output design files are generated by the writing unit 48 to accumulate the selected positions of the groups and buffers on the integrated circuit.

INITIALIZATION

Figure 2:
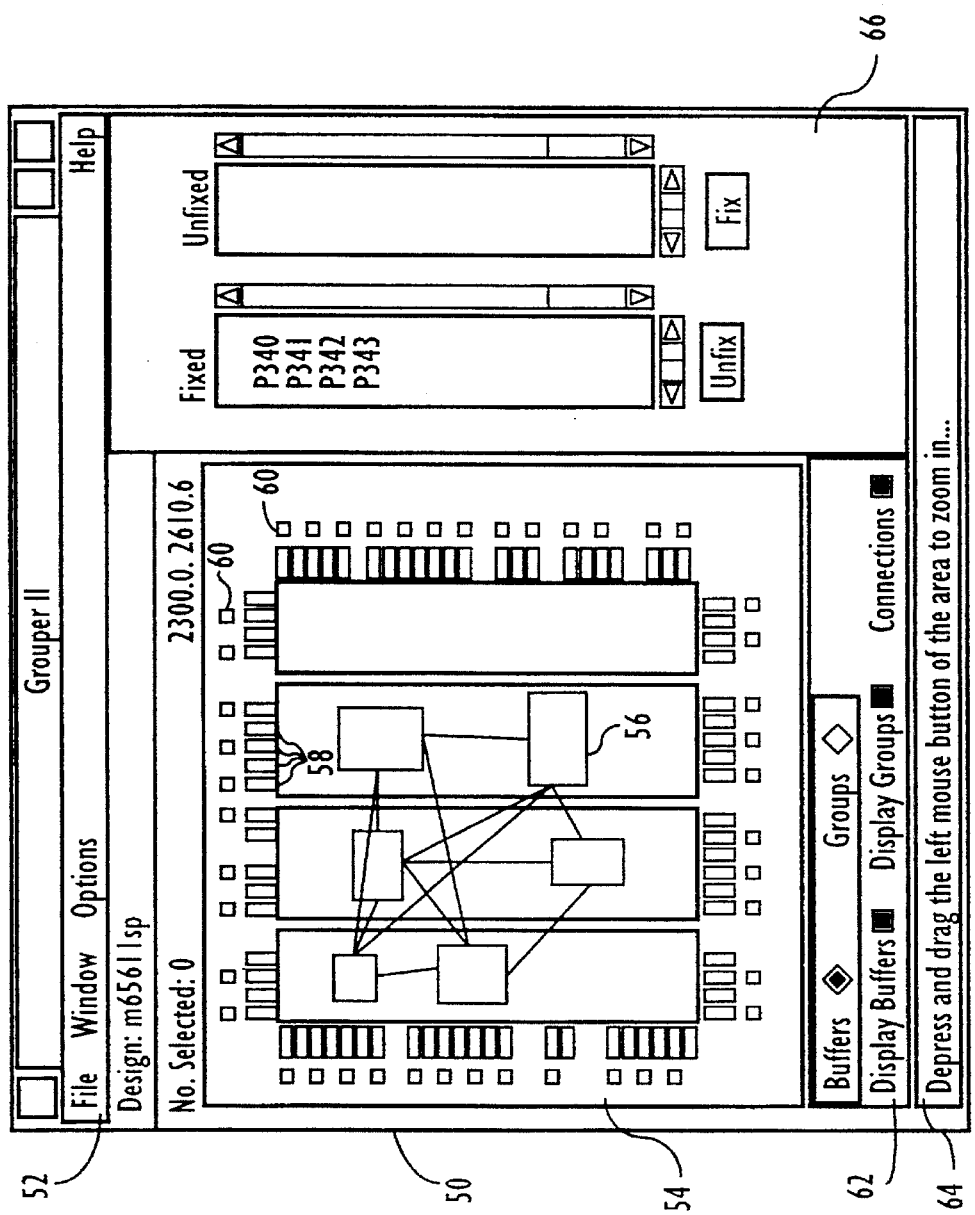
FIG. 2 shows an example of a Main Window displayed by a user interface of the placement system.

Reference is now made to FIG. 2, presenting the exemplary widgets displayed on the screen of the display 32b during initialization. A main window 50 displayed on the screen consists of five major areas:

— Main Menu Bar 52 provides a set of pull down menus "File", "Window" and "Options", which respectively allow the user to input and output design files, to modify the picture on the screen and to select and move the design elements. Also, the necessary help capabilities can be provided.

— Workspace Window 54 provides the user interface widget to manipulate groups 56 and buffers 58 on a design area representing an integrated circuit. The workspace window also shows pads 60 corresponding to the pins of the integrated circuit and the connections between the groups 56. In the upper left corner is the design name and the number of the design elements selected. In the upper right corner is the current position of the mouse.

— Toggle Options Window 62 provides buttons to turn on or off the display of groups, buffers or connections between the groups. Also, the selection of either operating on buffers or groups is provided.

— Information Window 64 provides the necessary messages that occur when executing the various operations. The information ranges from status to commands to error messages. Typically, the window informs the user of the next operation to perform when executing an option or informs the user of an error that occurs when executing an option.

— Worklist Window 66 provides the Buffer Worklist when the buffer option is chosen in the Toggle Options Window 62, and shows the Group Worklist when the group option is chosen. The Buffer Worklist comprises the fixed buffers (that have designated locations on an integrated circuit) and unfixed buffers (that do not have designated locations). The "Unfix" option allows the user to select one of the buffers that has been fixed on the design area and to unfix it. The "Fix" option allows the user to select one of the unfixed buffers and to fix it to a valid site on the design area.

Figure 3:
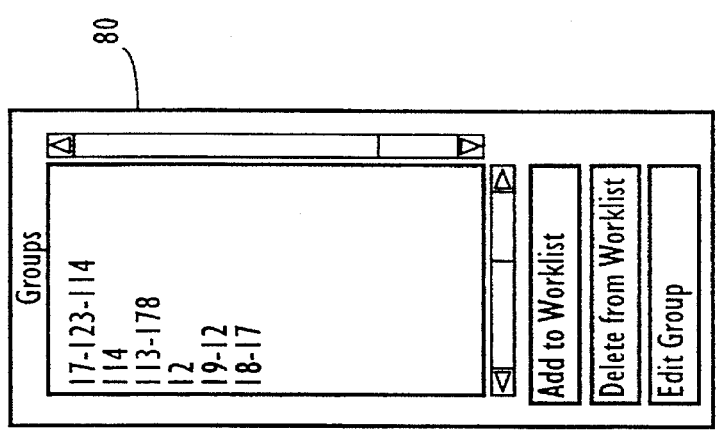
FIG. 3 shows an example of a Group Worklist Window which allows the user to control hierarchical grouping and to place the selected groups on a design area.

As shown in FIG. 3, the Group Worklist 80 comprises the groups that have been selected for grouping. The three types of groups are "Group by Region", "Group by Area" and "Group by Default". The "Group by Region" option sets the placement mode, which forces the layout tool to place the cells for a group within a certain region at a certain location on the design area. The "Group by Area" option sets the placement mode, which forces the layout tool to place the cells for a group within a certain region anywhere on the design area. The "Group by Default" option sets the placement mode, which forces the layout tool to place the cells for a group as close together as possible with no restrictions to the region for placing the cells. The Group Worklist Window provides the user with the "Edit Group" option to change the group type, with the "Add to Worklist" option to select a design element for grouping, and with the "Delete for Worklist" option to delete the selected group. These options are described in more detail later.

DATABASE CREATION

To create the database, the input design files 38 shown in FIG. 1 are read by the placement system to extract the necessary information. The system can be supplied with the following input design files:

— Master LEF file describes the valid buffer and cell sites on an integrated circuit (master) and also describes the size of a basic cell and a buffer site.

— Macro LEF file describes all of the macro cells (characterized fixed layouts that implement a particular electric function) available in a system library for the buffers and groups.

— Device file describes the pad and package pin correlations for the various available packages for integrated circuits.

— Buffer Coordinate file describes the buffer site location and orientation for the pad locations for the various packages available.

— Namelist file lists signal information for all of the groups and buffers.

— DEF (design exchange format) file describes the different cells and net connections in the design. This file can provide a user with the name of the package and floorplan desired for the design.

— Pin Assign file lists the signal names and the respective package pin location for each signal.

— Secondary VG file is the secondary buffer power and ground file, which lists secondary power and ground signals for the different types of cells.

Figure 4:
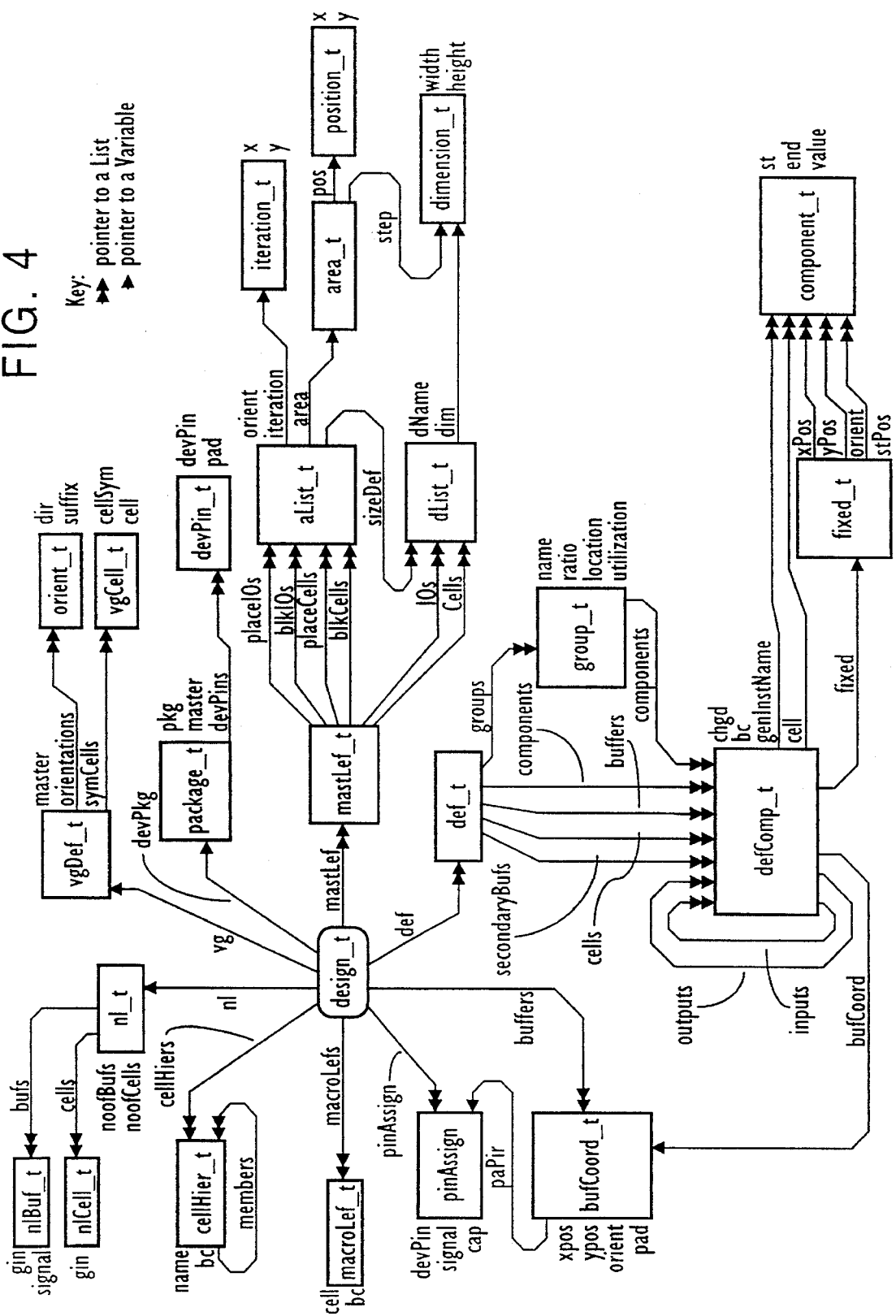
FIG. 4 shows the database structure for the placement system.

Reference is now made to FIG. 4 illustrating the database structure for the placement system. The following describes the various blocks used in the database, connections between the blocks and the name of the file that the information is extracted:

design_t — defines the core for accessing the database members in the structure and are as follows:

nl — the names of the buffers and cells used in the design. See the name list structure definition: nl_t for more details.

vg — the secondary power and ground information. See the structure definition: vgDef_t for more details.

devPkg — the package information. The package defines the master and the device pins associated with the package. See the structure definition: package_t for more details.

mastLef — the master information. The master defines the placable areas for the i/o buffers and cells. Also the buffer and cell sizes are defined within this structure. See the structure definition: mast_Lef_for more details.

def — the design exchange format (DEF) information. The def structure extracts the cell, buffer and group information defined for a design. See the structure definition: def_t for more details.

buffers — the valid i/o buffer site information. The location, orientation and pad names are defined for the buffers. See the structure definition: bufCoord_t for more details.

pinAssign — the pin to buffer name correspondence information. See the structure definition: pinAssign_t for more details.

macroLefs — the names of the macro cells and their corresponding basic cell count. See the structure definition: macroLef_t for more details.

cellHier — the cell hierarchy information. The cell names and the members which make up the cell are defined. See the structure definition: cellHier_t for more details.

nl_t — defines the list of buffers and cells used in the design. The values are extracted from the name list file and are as follows:

noofBufs — the number of buffers in the design.

noofCells — the number of cell instances (design elements used in a hierarchical design as a reference placed at one level of hierarchy to specify the element at the next lower level of hierarchy) in the design.

cells — the list of cell instance names used in the design. See the structure definition: nlCell_t for a description of each member in the list.

bufs — the list of buffers and their corresponding signal names that are used in the design. See the structure definition: nlBuf_t for a description of each member in the list.

nlCell_t — defines the cell instance name used in the design.

gin — the actual cell instance name. The cell instance name should match the instance name used in the DEF file.

nlBuf_t — defines the buffer instance name and the corresponding signal name.

gin — the actual buffer instance name. The buffer instance name should match the instance name used in the DEF file.

signal — the signal name. The signal name should match the signal name used in the Pin Assign file.

vgDef_t — defines for the master the suffixes that are attached to the secondary power and ground buffers based on the orientation. Also, the cell symbols are defined for the different secondary power cells.

master — the master name for the secondary power and ground information.

orientations — the list of orientation definitions to apply to the secondary power and ground cells. See the structure definition: orient_t for a description of each member in the list.

symCells — the list of cell instance names and their corresponding signal name. See the structure definition: vgCell_t for a description of each member in the list.

orient_t — defines the suffix to be attached to the cell instance name of the secondary power and ground buffers in the DEF file. The suffix is based on the placement orientation. The values for the structure are as follows:

dir — the direction of the secondary power and ground buffer.

suffix — the suffix associated with the direction. Empty strings define that a suffix is not needed.

vgCell_t — defines the signal names corresponding to the cell names for the secondary power and ground buffers in the DEF file. The signal names are the names used in the Pin Assign file.

cellSym — the signal name associated with the cell instance name for the secondary power and ground buffer.

cell — the cell instance name that is used for the cell in the DEF file.

package_t — defines the available device pins and their associated pads for the desired package. These pins define the valid locations for connecting the i/o buffer to the package. The values are extracted from the Device file and are as follows:

pkg — the name of the selected package. The package name is specified in the DEF file. If the package name is not specified, a user must select from a list of packages available. The different packages are specified in the Device file. In either case, this field stores the name of the package to be used with the design.

master — the name of the master associated with the package. The master name is specified in the Device file and should match the master name in the DEF file.

devPins — the list of device pins and their corresponding pads which are associated with the package.

devPin_t — defines the device pin and their corresponding pad for each valid i/o site on the package. The values for the structure are as follows:

devPin — the device pin number. The device number matches a device pin number used in the Pin Assign file.

pad — the pad name. The pad name matches the name used in the Buffer Coordinate file.

mastLef_t — defines the i/o and macro cell information for the design. In particular, the locations, dimension and area of the cells are defined. The values are extracted from the Master Lef file and are as follows:

placeIOs — the list of i/o site rows available for placement for an i/o buffer. See the structure definition: aList_t for a description of each member in the list.

blkIOs — the list of i/o site rows not available for placement for an i/o buffer. See the structure definition: aList_t for a description of each member in the list.

placeCells — the list of macro cell site rows available for placement for a macro cell. See the structure definition: aList_t for a description for each member in the list.

blkCells — the list of macro cell site rows not available for placement for a macro cell. See the structure definition: aList_t for a description of each member in the list.

IOs — the list of i/o types available for the master. Each member defines the width and height of the i/o. See the structure definition: dList_t for a description of each member in the list.

Cells — the list of macro cell types available for the master. Each member defines the width and height of the macro cell. See the structure definition: dList_t for a description of each member in the list.

aList_t — defines the various properties for the site row definition. In particular, the structure defines the orientation of the site row, the number of iterations in the x and y direction, the area of a site and step size in the x and y directions.

orient — the orientation of all the members in the site row definition.

iteration — the number of site row members in the x and y direction. See the structure definition: iteration_t for a description of each member.

area — the values which describe the area used by the site row definition. In particular, the location and the width and height of the step interval are defined. See the structure definition area_t for a description of the area values.

sizeDef — the dimensions of one member in the site row definition. See the structure definition: dList_t for a description of the dimension values.

iteration_t — defines the number of members in the x and y direction. The values associated with the structure are as follows:

x — the number of members in the x direction.
  y — the number of members in the y direction.

area_t — defines the location and the width and height of the step interval. The values associated with the structure are as follows:

pos — the position of the lower left corner of the area. See the structure definition: position_t for a description of the position values.

step — defines the width and height of the step interval. See the structure definition: dimension_t for a description of the step values.

position_t — defines the x and y values for the lower left corner of the area. The values associated with the structure are as follows:

x — the x value for the defined position.
  y — the y value for the defined position.

dimension_t — defines the dimensions of a member in the area. The values associated with the structure are as follows:

width — the width of the member.
  height — the height of the member.

dList_t — defines the various dimension properties for one cell. In particular, the structure defines the name of the cell and the width and height of the cell. The values for the structure are as follows:

dName — the cell instance name.

dim — defines the dimensions of a cell. See the structure definition: dimension_t for a description of the dimension values.

def_t — defines the group and component definitions used in the design. The values are extracted from the DEF file and are as follows:

groups — the list of group values. For each group member, the name, xy ratio, location, utilization and list of components are defined.

components — the list of component values. For each component member, the instance name, cell name, the fixed location and the basic cell size are defined. Also the input and output connections to the other components are defined.

buffers — the list of buffer components values. The values for each buffer component are the same as the component definition.

cells — the list of cell component values. The values for each cell component are the same as the component definition.

secondaryBufs — the list of secondary buffers. The values for each secondary buffer component are the same as the component definition.

defComp_t — defines the various properties for the DEF component member. In particular, the basic cell count is defined, the instance and cell names are defined and the fixed position for the cell is defined.

chgd — flag to set if the component properties have changed.

bc — the basic cell count (number of basic cells) for the component.

genInstName — the properties associated with an instance name. The properties are defined under the component_t structure definition below.

cell — the properties associated with the cell name. The properties are defined under the component_t structure definition below.

fixed — the properties associated with a DEF fixed definition. This definition only applies to buffer cells and is the location and orientation values for a placed i/o buffer. See the structure definition: fixed_t for more details.

component_t — defines the various properties for the component definition. In particular, the structure defines the start and end positions in the DEF file for the component name and also defines the value for the component.

st — the position in the DEF file where the component definition begins.

end — the position in the DEF file where the component definition ends.

value — the value in the DEF file for the component definition.

fixed_t — defines the various properties for the fixed buffer definition. In particular, the structure defines the location and orientation as well as the position in the DEF file where the fixed definition is written.

xPos — the x position for the buffer cell.
  yPos — the y position for the buffer cell.
  orient — the orientation of the buffer cell.
  stPos — the position in the DEF file where the fixed definition is written.

bufCoord_t — defines the buffer locations available in the design. The position, orientation and pad name are defined for the buffer. The values are extracted from the Buffer Coordinate file and are as follows:

xpos — the x position of the buffer. The value is based on the orientation of the buffer.

ypos — the y position of the buffer. The value is based on the orientation of the buffer.

orient — the orientation of the buffer. The orientation defines the direction of the buffer and the side that is facing up.

pad — the pad name associated with the buffer location.

paPtr — the pointer to the pin assign structure. The connection is based on the entry from the Device file.

pinAssign_t — defines the signal name, the associated device pin and if defined, the capacitance value for the i/o buffer. The values are extracted from the Pin Assign file and are as follows:

devPin — the device pin value. This value must match a device pin value in the device file.

signal — the buffer signal name that is attached to the device pin. The buffer signal name matches an instance name in the DEF file for primary buffers. For secondary buffers, the buffer signal name matches a cell symbol defined in the Secondary VG file.

cap — the capacitance value associated with the device pin — signal name pair.

macroLef_t — defines the different macro cells available and the basic cell count for the macro cell. The values are extracted from the Macro LEF file and are as follows:

cell — the macro cell name. The name matches the cell name in the DEF file and the Secondary VG file.

bc — the basic cell count associated the with the macro cell name.

cellHier_t — defines the cell hierarchy for the design. The values are extracted from the Namelist file and are as follows:

name — the cell name at the current level.

bc — the basic cell count for the current cell hierarchy.

members — the cell members which make up the cell. If the cell is a macro cell, then no members are defined. The cell members are defined recursively in the same manner as its parent.

BUFFER PLACEMENT

The Device and Buffer Coordinate files define the location and orientation of each buffer site on the integrated circuit. The Master LEF file describes the size of each buffer. By using this information, the buffer sites are displayed in the Workspace Window 54 (FIG. 2) on the screen of the display 32b. As the DEF file defines the buffers used in the design and their locations and orientations, the actual i/o buffers can be displayed in the Workspace Window 54.

To move an i/o buffer, a user can select the buffer, for example, by clicking a mouse button inside the desired site, and place the buffer into a new location. Also, a user can select an unfixed buffer in the Buffer Worklist Window 66 and fix it to a desired location on the integrated circuit. As the placed i/o buffer should be connected to circuitry external with respect to the integrated circuit, the buffer must be aligned with a pad 60 corresponding to a pin of the integrated circuit. If an invalid location is selected, an error message is displayed in the Information Window 64. If a valid location is selected, the highlighted buffer in Workspace Window 54 is placed at the new site.

DETERMINATION OF GROUP SIZE AND GROUP PLACEMENT

As indicated above, the Group Worklist Window 80 (FIG. 3) shows the groups that have been selected for placement. The option "Add to Worklist" allows a user to select a design element (instance) for grouping. This option brings a worklist with the ungrouped instances that appear at the top level of the design hierarchy. Each line of the worklist specifies the instance name and the gate count (number of gates) of the instance. If the instance is a macro cell, its name is also shown. To select an instance or instances for grouping, the user may click on the instances in the Worklist Window. In response, the placement system groups the macro cells that the instance is comprised of. Thus, if three instances have been selected for grouping, three groups are created, each representing the macro cells that make up the instance. If any of the instances (parent group) have children that are already grouped, a second worklist appears and the user is allowed to select the parent groups whose children are to be absorbed. Then, the children are removed from the group worklist and the parent group is placed in the group worklist.

One instance can be selected and the placement system can traverse, if desired, the hierarchy and display the next level of hierarchy. To expand a design hierarchy manually, the user may type the full path corresponding to a current level of hierarchy in the "Add to Worklist" area of the window 80. In response, the group worklist is updated to show the current level of hierarchy.

The option "Delete from Worklist" allows the user to select the desired groups for deleting from the group worklist.

The option "Edit Group" allows the user to define a group by Area, by Region or by Default in order to provide group placement in Parameterization, Location or Association mode, respectively.

In the Parameterization mode, the cells for a group are placed within a certain group area anywhere on the integrated circuit. The user defines the area by the utilization and aspect (x-y) ratios. The utilization ratio represents the ratio of the minimum area occupied if all cells are placed, to the actual area required for the cells. For example, if utilization ratio is 50% and the minimum area required for the cells is 100, then the actual area is 200. The aspect ratio represents the ratio of area width (x) to area height (y). Using these parameters along with the number of the basic cells for the group and the area of one basic cell, the system calculates MAXX, MAXY and MAXHALFPERIMETER parameters corresponding respectively to the possible x, y and half-perimeter values of the group area, as described in more detail later.

In the Location mode, the cells for a group are placed within a certain region at a certain location on the integrated circuit. The region is defined by the utilization and aspect ratios. Also, the user selects the location on the integrated circuit. Then, by using these parameters along with the number of the basic cells in the group and the area of one basic cell, the REGION X and REGION Y parameters corresponding to the x and y values for the region are calculated, as described in more detail later. In this mode, the MAXX, MAXY and MAXHALFPERIMETER default to the entire integrated circuit.

In the Association mode, the cells for a group are placed as close together as possible. However, no restrictions are applied to the region to place the cells. In this mode, the MAXHALFPERIMETER is set to the half-perimeter of the entire integrated circuit and the MAXX and MAXY are set to the value of MAXHALFPERIMETER. To calculate the REGION X and REGION Y parameters, the actual area required for the group is determined based on the number of basic cells in the group and the area of one basic cell, as follows:

$$<AREA> = \frac{<\text{Sum of basic cells in the group}> \times <\text{Area of one basic cell}>}{<\text{Utilization}>} \quad (1)$$

Based on the area calculation and the spect ratio, the REGION X and REGION Y can be determined as follows:

$$\text{AspectRatio} = <\text{Width}>:<\text{Height}> \quad (2)$$

$$<\text{RegionX}> = \sqrt{\frac{<\text{Width}>}{<\text{Height}>} \times <\text{Area}>} \quad (3)$$

-continued $$<RegionY> = \sqrt{\frac{<Height>}{<Width>} \times <Area>} \quad (4)$$

To determine the MAXHALFPERIMETER, an aspect ratio of 1:1 is used and values REGION X and REGION Y are summed, as follows:

$$<MAXHALFPERIMETER> = \sqrt{\frac{1}{1} \times <Area>} + \sqrt{\frac{1}{1} \times <Area>} \quad (5)$$

$$= 2 * \sqrt{<Area>}$$

The MAXX and MAXY values are calculated using the formulas (3) and (4), respectively. However, both these values are required to be at least 75% of MAXHALFPERIMETER. Thus, the calculation is as shown below:

If $$\sqrt{\frac{<Width>}{<Height>} \times <Area>} > \frac{3}{4} \times <MAXHALFPERIMETER> \quad (6)$$

then $$<MAXX> = \sqrt{\frac{<Width>}{<Height>} \times <Area>} \quad (7)$$

Else $<MAXX> = \frac{3}{4} \times <MAXHALFPERIMETER>$ (8)

If $$\sqrt{\frac{<Height>}{<Width>} \times <Area>} > \frac{3}{4} \times <MAXHALFPERIMETER> \quad (9)$$

then $$<MAXY> = \sqrt{\frac{<Height>}{<Width>} \times <Area>} \quad (10)$$

Else $<MAXY> = \frac{3}{4} \times <MAXHALFPERIMETER>$ (11)

If no utilization and aspect ratio values have been assigned to the group, the values from the previous group are used. If a previous group does not exist, then the values are set as follows: utilization ratio is set to 50%, the aspect ratio is set to 1:1. A new group is always placed in the Association mode.

If the group has cells which already been placed on the design, then the Workspace Window shows the cells at their placed locations. If the Location placement mode is set, then the group's region tries to cover all the placed cells that appear on the design. A warning message is displayed in the Information Window if placed cells are not within the group's region. However, the group can still be placed at the selected location even though some of the placed cells are not within the group's region.

Each group is represented in the Workspace Window by a boundary box 56 (FIG. 2) corresponding to the determined size of the group. When the group first appears in the Location placement mode, the user can either confirm the group's location or move a bounding box representing the size of the group to the desired location inside the integrated circuit boundary using, for example, a mouse. The Edit Group option allows the user to modify the group's utilization and aspect ratio values.

The placement system evaluates the group's values and verifies that the modified parameters do not require the group to extend beyond the integrated circuit boundaries. If any of the values require the group to extend beyond the boundaries or are specified incorrectly, a warning message indicates the maximum values allowed. If the user chooses to ignore the invalid values, the placement system sets them to the maximum allowable values. Alternatively, the user can set any of the desired values within the allowable limits.

If the values are valid and the group has been placed, then the group's boundary box is adjusted to reflect the changes. Also, if the values force a placed group to extend beyond the integrated circuit boundary, then the placement system adjusts the group's placement to fit within the boundary.

As indicated above, the Toggle Option Window 62 (FIG. 2) allows the user to see the connection lines between the groups displayed in the Workspace Window 54.

WRITING DESIGN FILES

After the buffer and group placement, the placement system saves the DEF and Pin Assign files either under the current name or under a new name. The DEF file saves the group and buffer changes and the Pin Assign file saves only the buffer changes. The files are generated using the system database 40, which receives the information about the user changes during the buffer and group placement modes.

The DEF file writes the following for each placed buffer:

1. The buffer name.

2. The cell name associated with the buffer name.

3. The coordinate of the lower left corner of the buffer site or sites.

4. The orientation of the buffer site.

Also, the DEF file writes the following for each placed group:

1. The names of the components for the group.

2. The number of basic cells used.

3. The selected utilization ratio.

4. The selected aspect ratio.

5. The coordinate of the lower left corner of the group on the integrated circuit.

6. The width and height of the group.

The Pin Assign file writes the following for each buffer:

1. The integrated circuit pin associated with the buffer.

2. The buffer name.

There accordingly has been described a placement system, which allows a user to hierarchically group design elements and place a set of groups on an integrated circuit. Using input design files, the system creates a database, which defines the design elements to be grouped and the groups to be placed on the design area. The groups are defined by their size, calculated using utilization and aspect ratio values. The system allows the user to modify the group parameters and to move the groups and i/o buffers to a desired location within the design area.

In this disclosure, there is shown and described only the preferred embodiment of the invention, but it is to be understood that the invention is capable of changes and modifications within the scope of the inventive concept as expressed herein.

What is claimed is:

1. A placement system controlled by a user for hierarchically grouping a plurality of design elements into groups and selecting their positions on a design area, comprising:

means responsive to input information for creating a database defining said design elements and said design area, means responsive to said database for enabling said user to select positions of input/output terminals on said design area for connecting said design elements within said design area with circuitry outside said design area, means responsive to said database for determining, prior to the placement of the design elements, the size of regions on said design area to be occupied by said groups of design elements, based on the number of basic cells in each of the groups and the area of one of the basic cells, means responsive to the determined size of said regions and the selected positions of the input/output terminals for enabling said user to place said groups on said design area.

2. The placement system of claim 1 further comprising means for forming output data defining the selected positions of said groups and said input/output terminals.

3. The placement system of claim 1, wherein said means for determining the size of regions comprises means for defining the group based on the number of design elements in the group and the utilization ratio of a region where the group is to be positioned.

4. The placement system of claim 1, wherein said means for determining the size of regions comprises means for defining the group based on the number of design elements in the group and the aspect ratio of a region where the group is to be positioned.

5. The placement system of claim 1, wherein said means for placing the groups comprises means for locating each of the groups within a region defined by its aspect ratio.

6. The placement system of claim 1, wherein said means for placing the groups comprises means for locating the design elements for each of the groups at a selected location on said design area within a region defined by its aspect ratio.

7. The placement system of claim 1, wherein said means for selecting positions of input/output terminals comprises means responsive to said database for displaying input/output buffers used for transferring signals in and out of the design area and means for placing the displayed input/output buffers at a predetermined position with respect to pins of an integrated circuit defined by said design area.

8. A method of placing a plurality of design elements on an integrated circuit using a placement system, said method comprising the steps of:

supplying the placement system with input information to define said design elements and said integrated circuit, enabling a user to select positions of input/output terminals on said integrated circuit for connecting said design elements on said integrated circuit with external circuitry based on said input information, hierarchically grouping said design elements into a plurality of groups, prior to the placement of the design elements, determining the size of regions on said integrated circuit to be occupied by said groups using said input information, based on the number of basic cells in each of the groups and the area of one of the basic cells, enabling the user to place said groups on said integrated circuit based on the determined size of said regions and the selected positions of the input/output terminals.

9. The method of claim 8 further comprising the step of forming output data defining the selected positions of said groups and said input/output terminals.

10. The method of claim 8, wherein said step of determining the size of regions comprising the step of defining the group based on the number of design elements in the group and the utilization ratio of a region where the group is to be placed.

11. The method of claim 8, wherein said step of determining the size of regions comprising the step of defining the group based on the number of design elements in the group and the aspect ratio of a region where the group is to be placed.

12. The method of claim 8, wherein said step of placing the groups comprising the step of locating each of the groups within a region defined by its aspect ratio.

13. The method of claim 8, wherein said step of placing the groups comprising means for locating the design elements for each of the groups at a selected location on said design area within a region defined by its aspect ratio.

14. The method of claim 8, wherein said step of selecting positions of input/output terminals comprising the step of displaying input/output buffers used for transferring signals in and out of the design area and the step of moving the displayed input/output buffers to a predetermined position with respect to pins of an integrated circuit defined by said design area.

15. In an element placement system having a display for visualizing layout of an integrated circuit comprising a plurality of logic cells, a method for grouping said logic cells comprising the steps of:

supplying the placement system with input information to define said logic cells and said integrated circuit, combining said logic cells into a plurality of groups defined by the size of an area on said integrated circuit to be occupied by each group, the size of said area being determined prior to the placement of the logic cells, based on the size of said logic cells in the group and the number of the logic cells in the group, displaying said plurality of groups and said integrated circuit on said display, moving said plurality of groups to selected positions on said integrated circuit.

16. The method of claim 15, wherein the size of said area is determined based on its aspect ratio.

17. The method of claim 16, wherein the size of said area is determined based on its utilization ratio.

18. The method of claim 15, wherein each of said groups is placed in a selected region having a predetermined aspect ratio.

19. The method of claim 18, wherein each of said groups is moved within said selected region.

20. A placement system controlled by a user for hierarchically grouping a plurality of design elements into groups and selecting their positions on a design area, comprising:

means responsive to input information for creating a database defining said design elements and said design area, means responsive to said database for enabling said user to select positions of input/output terminals on said design area for connecting said design elements within said design area with circuitry outside said design area, means responsive to said database for determining, prior to the placement of the design elements, the size of regions on said design area to be occupied by said groups of design elements, based on the number of basic cells in each of the groups and the area of one of the basic cells, means responsive to the determined size of said regions and the selected positions of the input/output terminals for indicating to said user places of said groups on said design area.

* * * * *